United States Patent [19]

Skoog et al.

[11] Patent Number: 5,019,720
[45] Date of Patent: May 28, 1991

[54] INTEGRATED CIRCUIT DRIVER FOR SERIAL BUS HAVING OUTPUT OVERVOLTAGE PROTECTION

[75] Inventors: Steven K. Skoog; Ernest W. Cordan, Jr., both of Colorado Springs, Colo.

[73] Assignee: NCR Corporation, Dayton, Ohio

[21] Appl. No.: 491,795

[22] Filed: Mar. 12, 1990

[51] Int. Cl.[5] .......................................... H03K 17/16
[52] U.S. Cl. .................................. 307/270; 307/443; 307/475; 307/263; 307/296.5; 320/85.1
[58] Field of Search .............. 307/443, 451, 473, 475, 307/491, 263, 270, 296.4, 296.5, 303.2; 340/825.62; 361/91; 320/85.1

[56] References Cited

U.S. PATENT DOCUMENTS

| | | | |
|---|---|---|---|
| 4,091,361 | 5/1978 | Eichelberger et al. | 340/825.62 X |
| 4,380,710 | 4/1983 | Cohen et al. | 307/475 |
| 4,488,065 | 12/1984 | Doty | 307/350 |
| 4,706,082 | 11/1987 | Miesterfeld et al. | 370/95 X |
| 4,739,323 | 4/1988 | Miesterfeld et al. | 370/85 X |
| 4,746,818 | 5/1988 | Hafner | 307/475 X |
| 4,855,620 | 8/1989 | Duvvury et al. | 361/91 X |
| 4,857,863 | 8/1989 | Ganger et al. | 307/263 X |
| 4,882,507 | 11/1989 | Tatsumi et al. | 307/270 X |
| 4,887,262 | 12/1989 | van Veldhuizen | 370/85.1 |
| 4,918,329 | 4/1990 | Milby et al. | 307/443 X |
| 4,930,112 | 5/1990 | Tanaka et al. | 307/295.4 X |
| 4,959,561 | 9/1990 | McDermott et al. | 307/443 |

OTHER PUBLICATIONS

Miesterfeld, "Chrysler Collision Detection (C[2]D)-a Revolutionary Vehicle Network", Feb. 24, 1986, *SAE Technical Paper Series*, 860389.

Fassnacht et al., "Chrysler Collision Detection (C[2]D TM) Bus Interface, Integrated Circuit User Manual", Feb. 29, 1988, *SAE Int'l Congress*.

"Integrated Circuit-Universal C[2]D Differential Serial Bus Interface", *Chrysler Corporation Engineering Standard* No. PF-8219, Jun. 1986.

*Primary Examiner*—David Hudspeth
*Attorney, Agent, or Firm*—Stephen F. Jewett; Wilbert Hawk, Jr.; Douglas S. Foote

[57] ABSTRACT

An integrated circuit driver for high and low lines in a bus. The driver comprises first and second current sources connected to high and low voltage sources, respectively, and first and second transistor circuits for blocking voltage spikes higher or lower than the voltages provided by the high and low voltage sources. The first current source and the first transistor circuit are series connected between the high voltage supply and the high line, and the second current source and the second transistor circuit are series connected between the low voltage source and the low line.

66 Claims, 10 Drawing Sheets

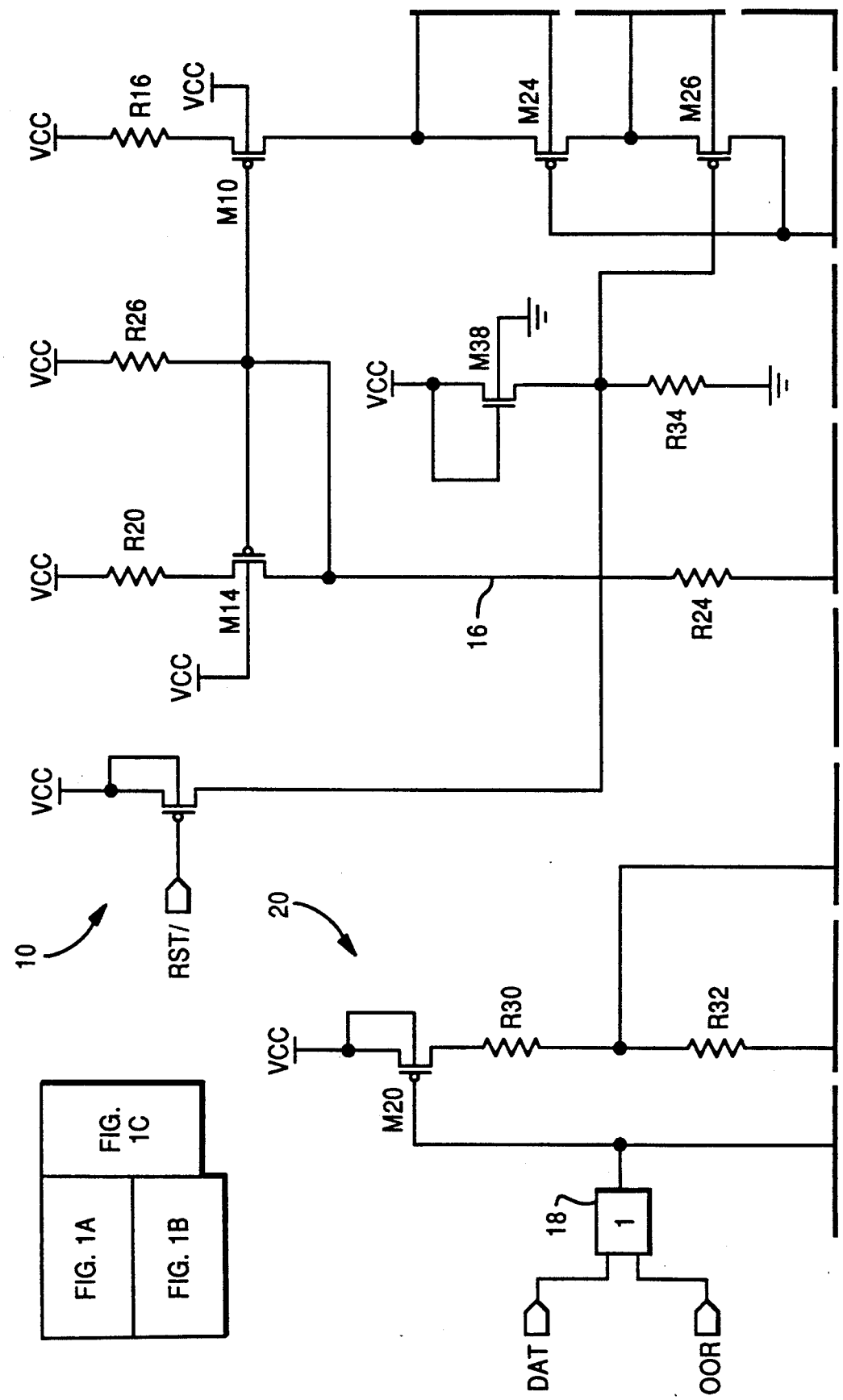

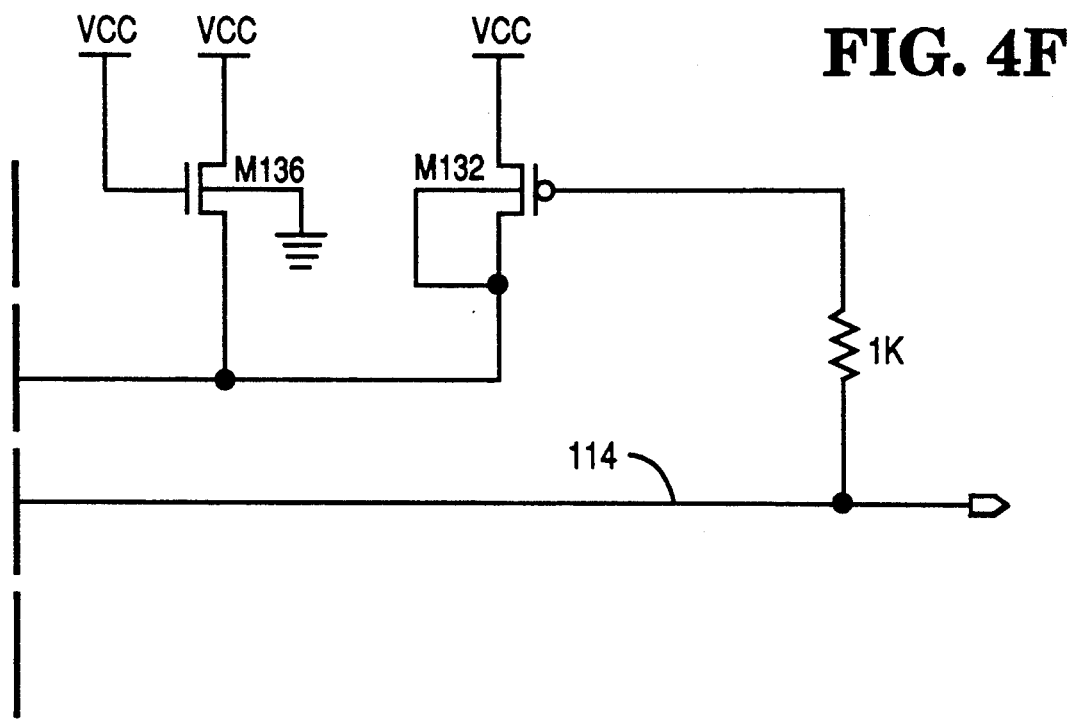
FIG. 4F
FIG. 4
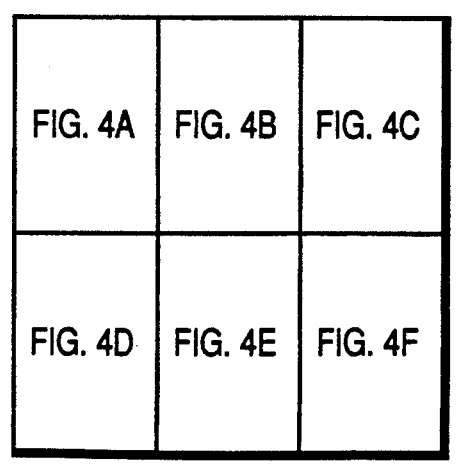

INTEGRATED CIRCUIT DRIVER FOR SERIAL BUS HAVING OUTPUT OVERVOLTAGE PROTECTION

The present invention relates to an integrated circuit driver for a serial bus. More particularly, it relates to an analog driver which has highly matched current sources and which prevents leakage paths resulting from voltage spikes on the bus.

CROSS-REFERENCE TO RELATED APPLICATIONS

This application is related to co-pending application Ser. No. 288 655, filed Dec. 22, 1988 now U.S. Pat. No. 4,890,010.

BACKGROUND OF THE INVENTION

A bus for handling the transmission of serial data typically employs two complementary, high and low lines. A first digital data bit ("1" or "0") is defined when the lines assume the same voltage, sometimes referred to as the "common mode voltage". A second digital data bit is defined when the voltage difference between the two lines, referred to as the "differential mode voltage", is driven above a threshold potential.

In one type of transmission bus, the common mode voltage is a value midway between high and low voltage sources. When the lines are driven to the differential mode voltage by a driver, a receiver connected to the bus will sense this differential mode voltage and interpret it as a digital bit. It is particularly critical when driving the lines to the differential mode voltage that the common mode voltage is the reference midpoint about which the high and low lines symmetrically swing. If the midpoint is disturbed to the extent that the differential mode voltage bumps up against the high or low voltage sources, the differential mode voltage can shrink. If the differential mode voltage is too small, the receiver may not be able to accurately read it.

Some transmission buses are designed for multiple users, i.e., buses which have a number of transmitting entities or drivers which may compete for the bus at the same time. If the transmitting entities are connected to such a bus and have priority on a first come, first serve basis, there is a possibility of one entity creating electrical interference with another. For example, each transmitting entity is tied to a high and low reference voltage. If one of these reference voltages is "lost", the internal control voltages of that entity may vary widely with respect to the common mode and differential mode voltages appearing on the bus. This may result in the common mode and/or differential mode voltages appearing as positive or negative voltage spikes with respect to the internal control voltages within the entity. If the entity were to sink or otherwise create a leakage path for such voltage "spikes," the common mode voltage could be easily disturbed. This can result in data being transmitted in error.

OBJECTS OF THE INVENTION

It is therefore an object of the present invention to provide a new and improved integrated circuit driver for a serial bus.

It is another object of the present invention to provide a two line, serial bus driver which does not skew the common mode voltage of the bus.

It is a further object of the present invention to provide an analog driver, for a serial bus, having highly matched current sources.

It is yet another object of the present invention to provide a two line, serial bus driver which reduces electrical interference on the bus.

It is yet a further object of the present invention to provide a bus driver which does not leak significant current in the presence of a voltage spike on the bus.

SUMMARY OF THE INVENTION

The present invention is an integrated circuit driver for high and low lines in a bus. The driver comprises first and second current sources connected to high and low voltage sources, respectively, and first and second means for blocking voltage spikes higher or lower than the voltages provided by the high and low voltage sources. The first current source and the first blocking means are series connected between the high voltage supply and the high line, and the second current source and the second blocking means are series connected between the low voltage source and the low line.

BRIEF DESCRIPTION OF THE DRAWINGS

FIGS. 1A-1C show a circuit diagram of an integrated circuit driver for a serial bus according to one form of the present invention.

FIGS. 4A-4F show a circuit diagram of an integrated circuit driver for a serial bus according to an alternative form of the present invention.

DESCRIPTION OF A PREFERRED EMBODIMENT

Figure 1B:
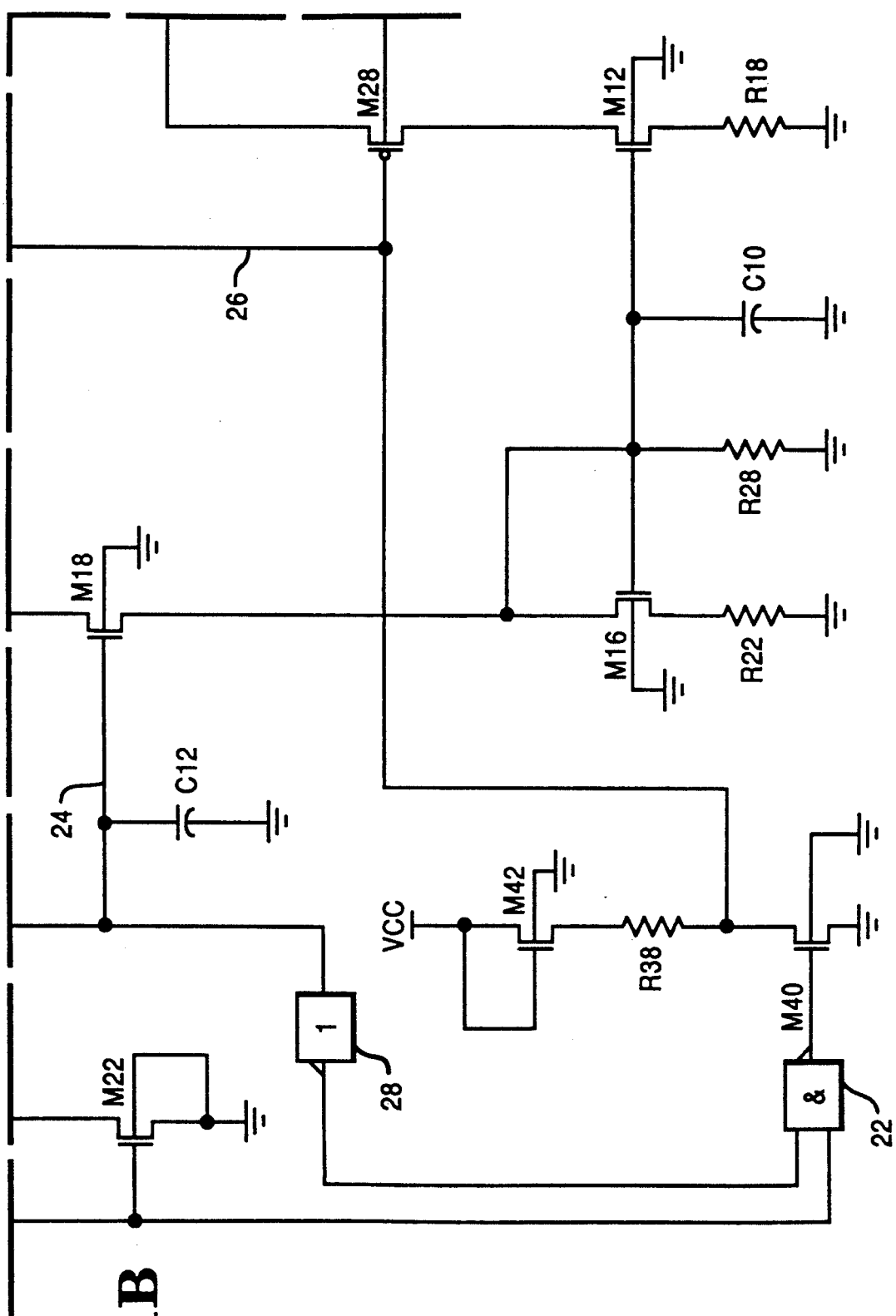
Figure 1C:
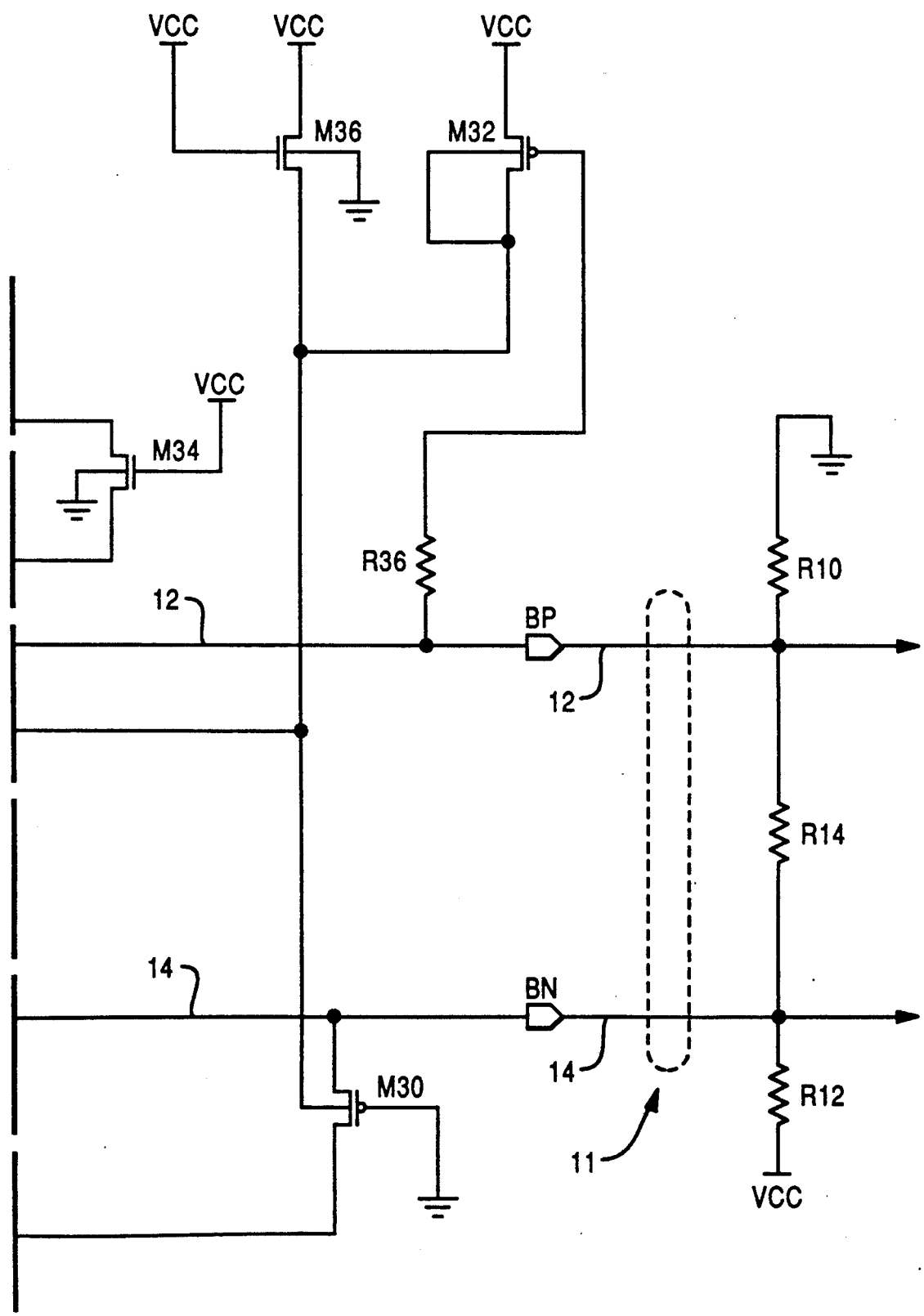

FIGS. 1A, 1B and 1C; assembled according to the FIG. 1 map, show a circuit driver 10 according to one form of the present invention. Driver 10 is connected to a serial data transmission bus 11 which includes a high line 12 and a low line 14. High line 12 is connected to ground through resistor R10, and low line 14 is connected to a voltage source VCC through resistor R12. High line 12 and low line 14 are connected by a resistor R14. In a preferred embodiment, VCC is about 5 volts, resistors R10 and R12 are about 13K ohms, and resistor R14 is about 60 ohms. Driver 10 receives a data input signal DAT and provides a bus positive BP signal and a bus negative BN signal to high line 12 and low line 14, respectively.

Driver 10 is intended to be implemented as an integrated circuit as will be described more fully hereinafter. In a preferred embodiment, the integrated circuit has a substrate of P type conductivity. Thus, each of the N type transistors may be constructed directly in the substrate. However, the P type transistors are constructed in the substrate in a well of N type conductivity. The present invention may also be implemented in an N type substrate with the conductivity type of the various blocking transistors, as will be discussed, reversed accordingly.

Driver 10 includes two current sources for driving high line 12 and low line 14, respectively. One such current source includes a PMOS field effect transistor M10 series connected with resistor R16 to high voltage source VCC. The other current source includes NMOS field effect transistor M12 series connected with resistor R18 to the low voltage source ground. The source of transistor M10 is connected to VCC through resistor R16 and its well tie is connected to VCC. Similarly, the source of transistor M12 is connected to ground through resistor R18 and its substrate tie is connected to ground. The term "current source" as used herein encompasses both current supplies and current sinks.

Driver 10 also includes a current path 16 from VCC to ground. Path 16 includes PMOS field effect transistor M14, NMOS field effect transistors M16 and M18, and resistors R20, R22 and R24. The source of transistor M14 is connected to VCC through resistor R20, its well tie is connected to VCC, and its drain is connected to its gate. The gate of transistor M14 is also connected to the gate of transistor M10 in a current mirror configuration. The source of transistor M16 is connected to ground through resistor R22, its substrate tie is connected to ground, and its drain is connected to its gate. The gate of transistor M16 is also connected to the gate of transistor M12 in a current mirror configuration. Resistor R24 is series connected with transistor M18 between the drains of transistors M14 and M16. The gate of transistor M18 is connected to a control line 24 and receives a data signal to determine when the current sources are to be turned on.

A pull up resistor R26 is connected between VCC and the gates of transistors M14 and M10. This keeps transistor M10 off by pulling its gate voltage to VCC when transistor M18 is turned off. A pull down resistor R28 is connected between ground and the gates of transistors M16 and M12. This keeps transistor M12 off by pulling its gate voltage to ground when transistor M18 is turned off. A capacitor C10 is also connected between ground and the gates of transistors M12 and M16. Since the gate capacitance of PMOS transistors M10 and M14 is different than the gate capacitance of NMOS transistors M12 and M16, capacitor C10 is selected to match the gate capacitances of transistors M12 and M16 with M10 and M14. In this manner, the turn on time and turn off time of transistors M10 and M12 will be nearly the same thereby preventing the common mode voltage on data bus 11 from wandering. In a preferred embodiment, transistors M10 and M14 are p-channel LDD type transistors with length/width of 4400/6.6 (microns), and transistors M12 and M16 are n-channel LDD type transistors with length/width of 2200/6.6 (microns). Resistors R16 and R20 are each 80 ohms, resistors R18 and R22 are each 40 ohms, resistors R26 and R28 are each 360K ohms, and capacitor C10 is 20.0 pF.

Figure 2:
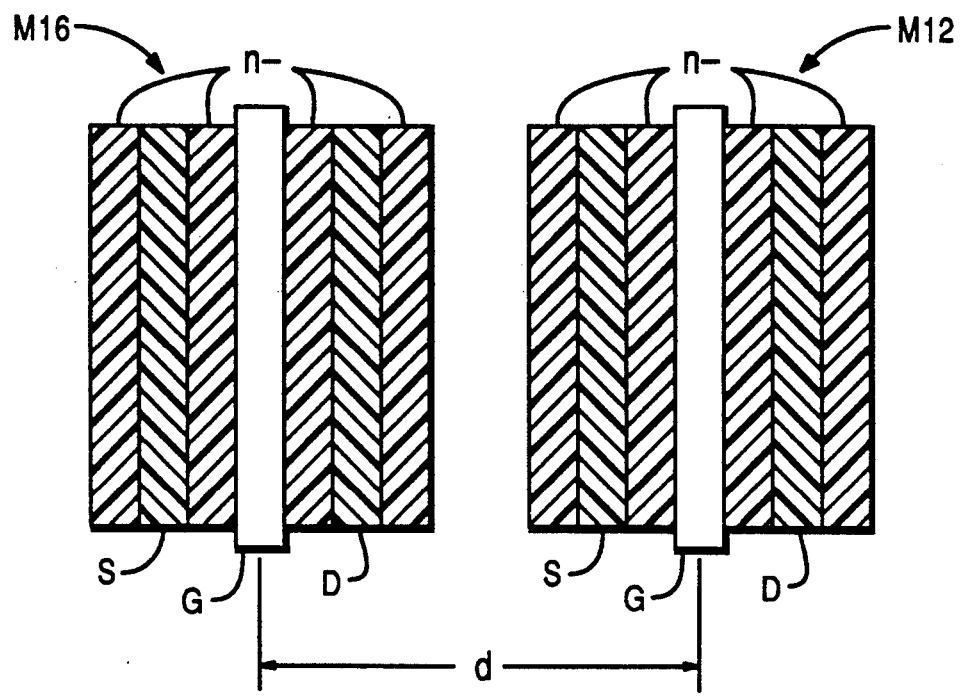
FIG. 2 is a top view of a current mirror layout.
Figure 3:
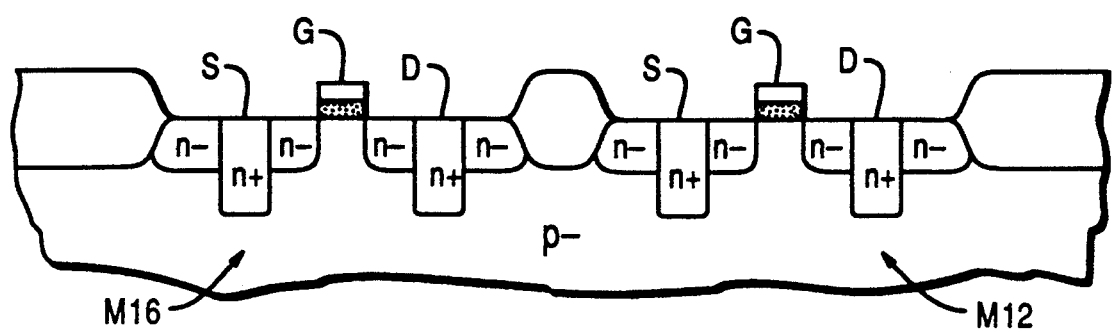
FIG. 3 is a side view of the current mirror layout of FIG. 2.
Figure 4A:
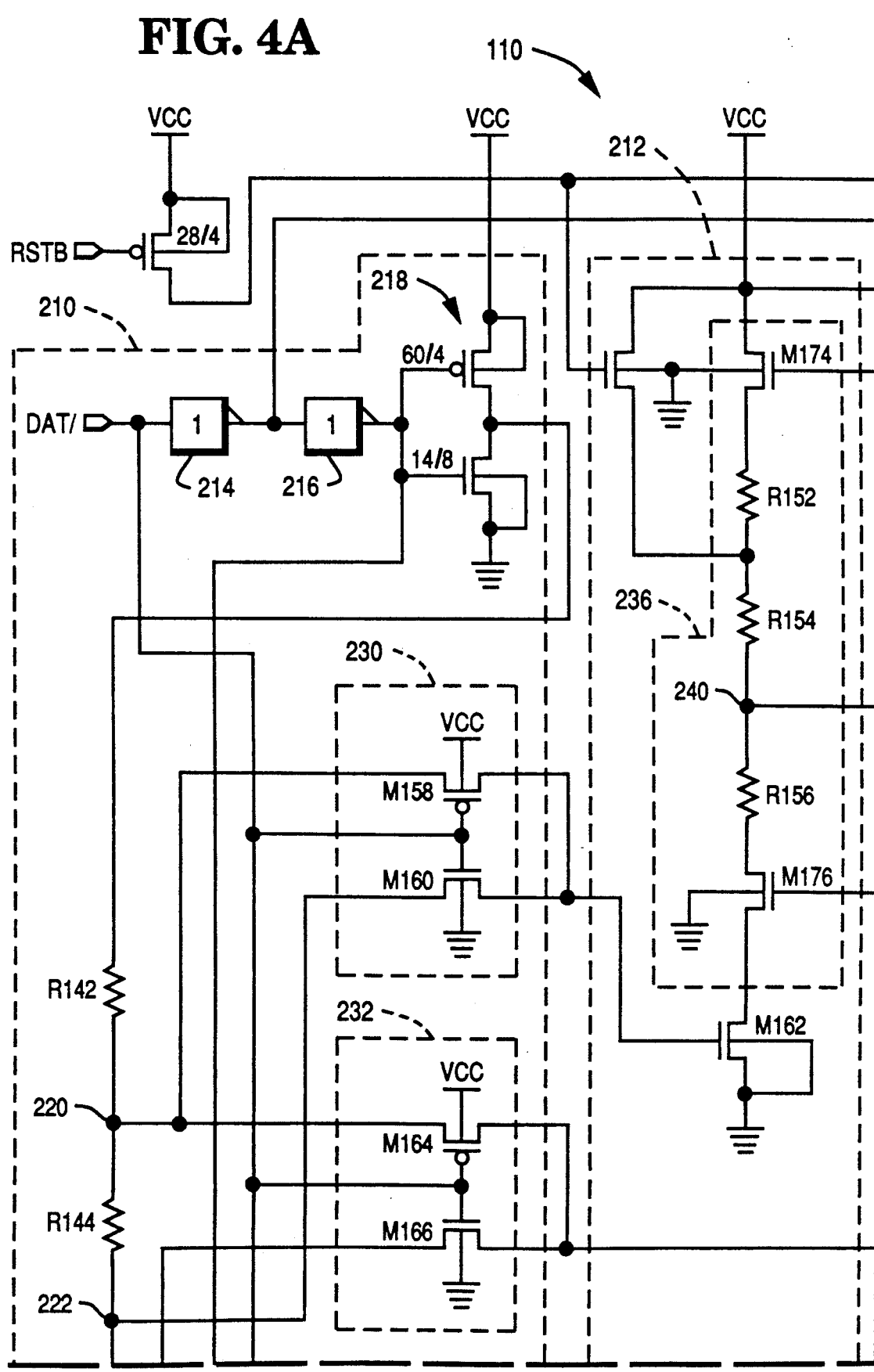
Figure 4B:
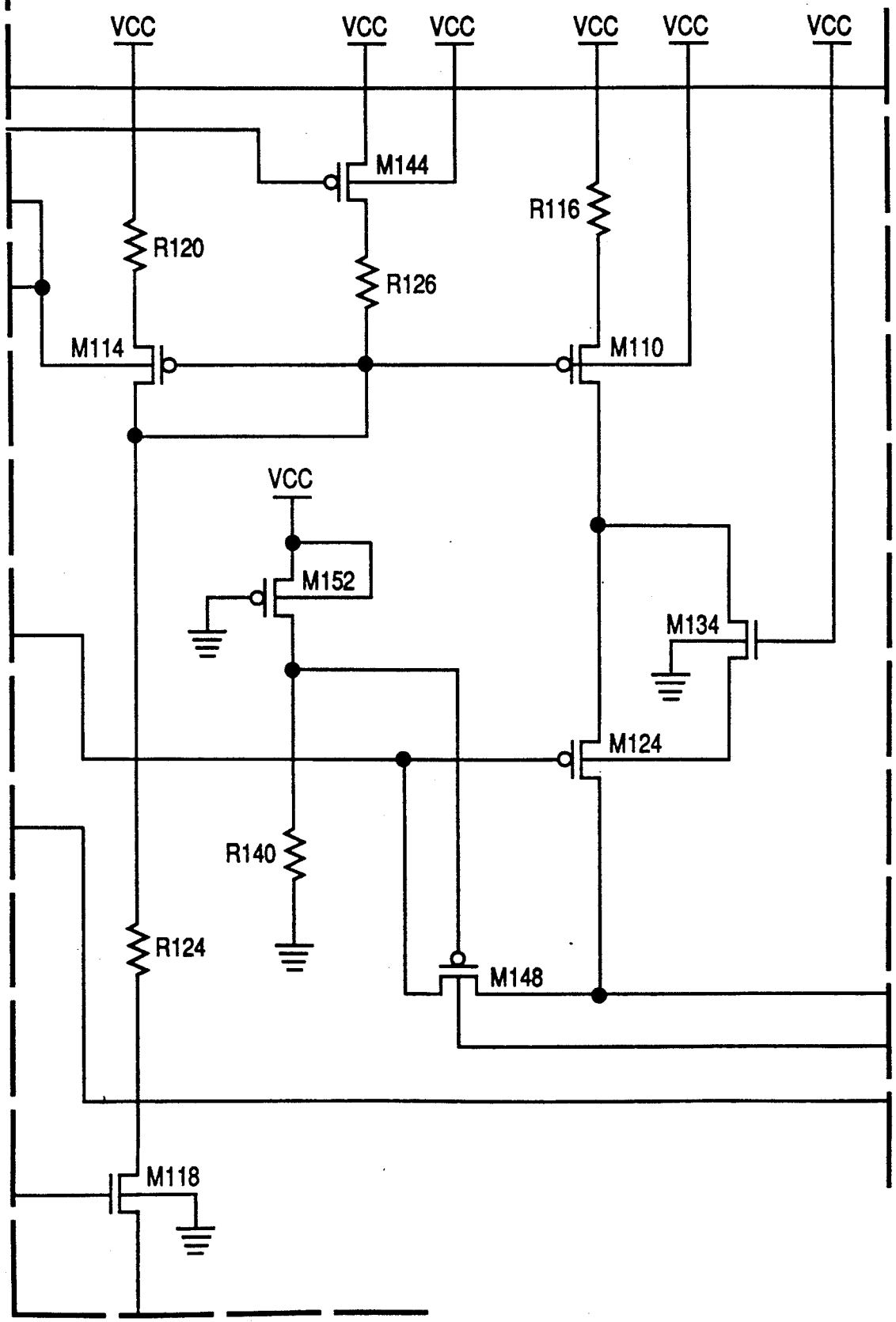
Figure 4C:
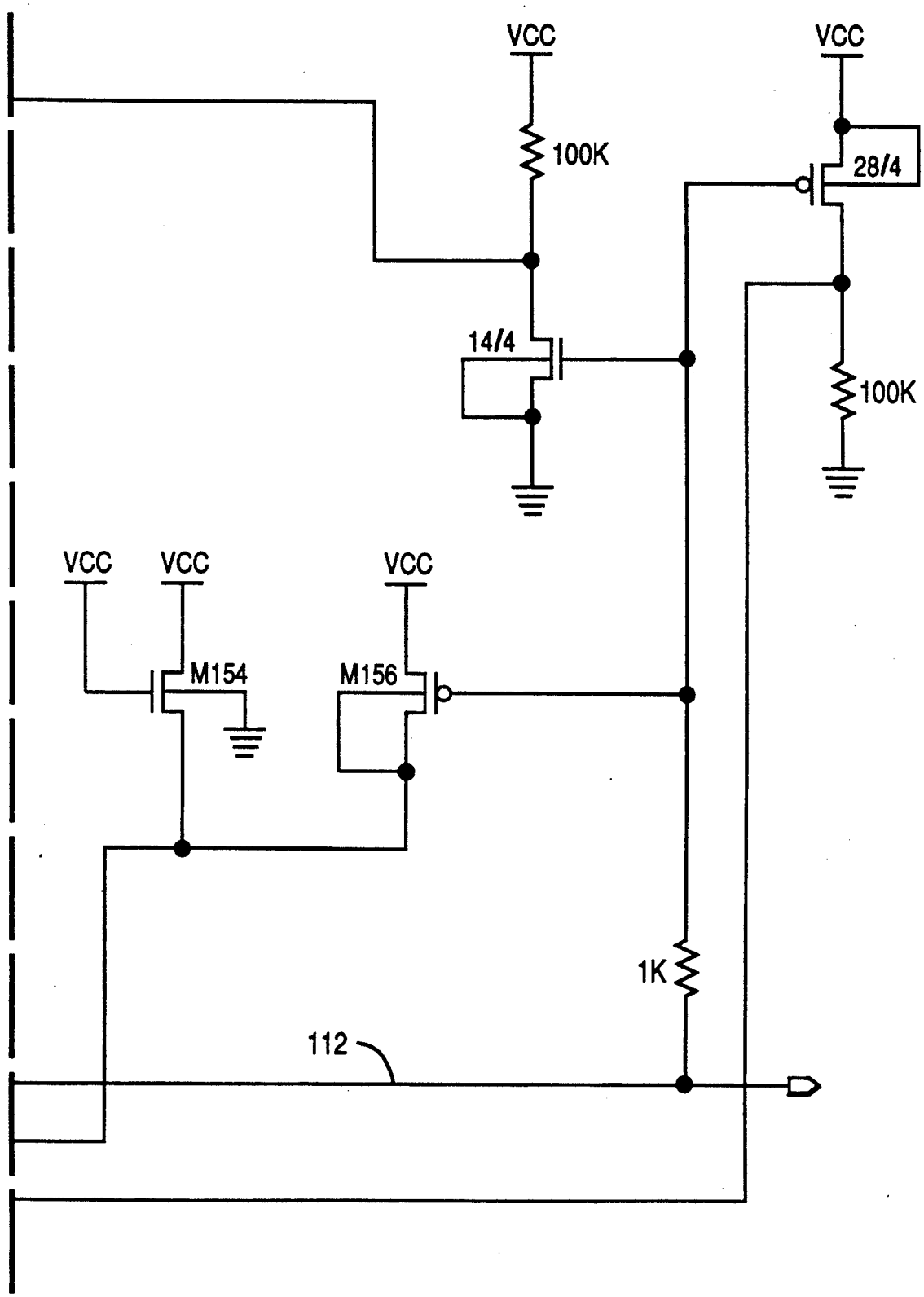
Figure 4D:
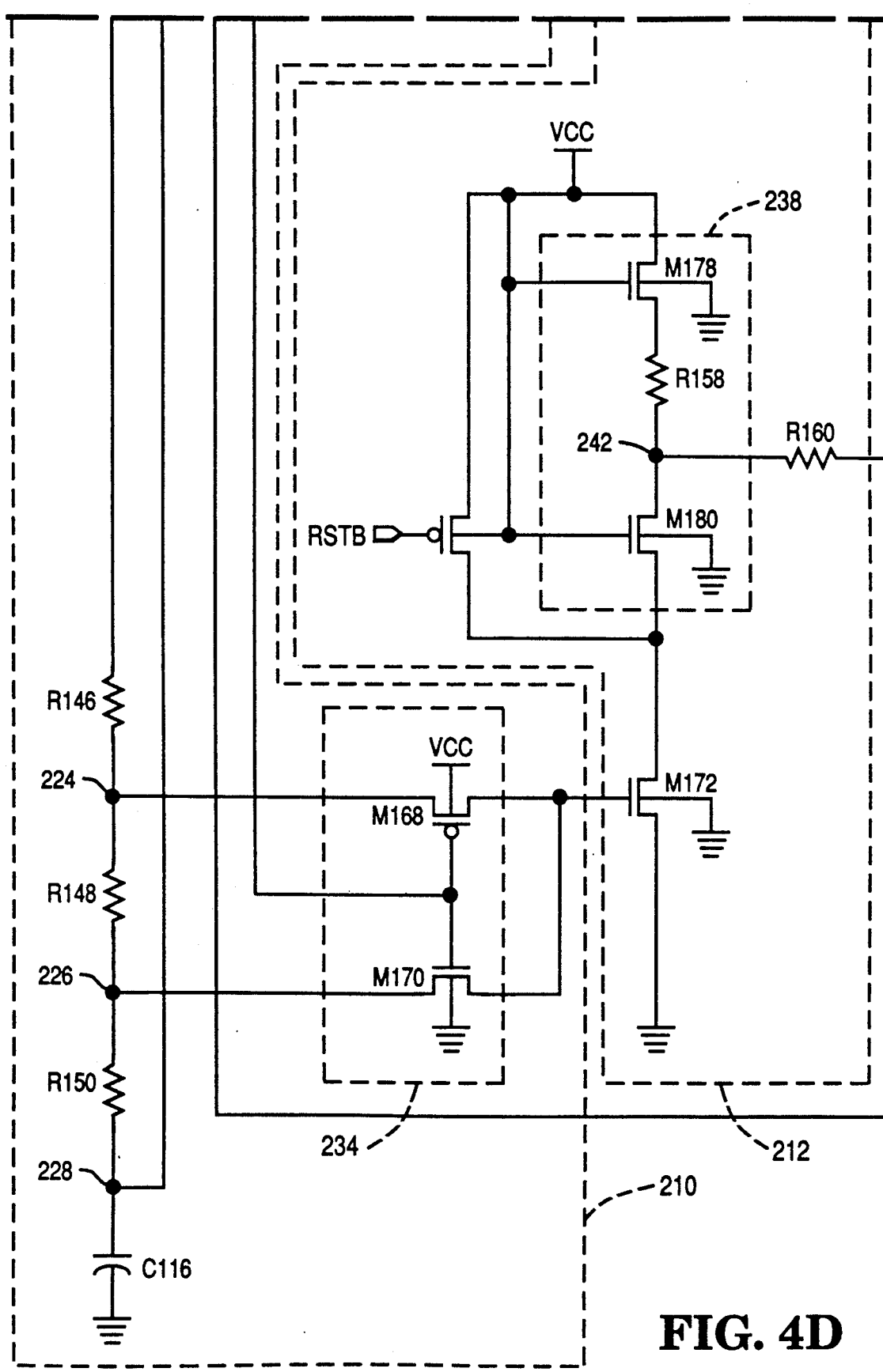
Figure 4E:
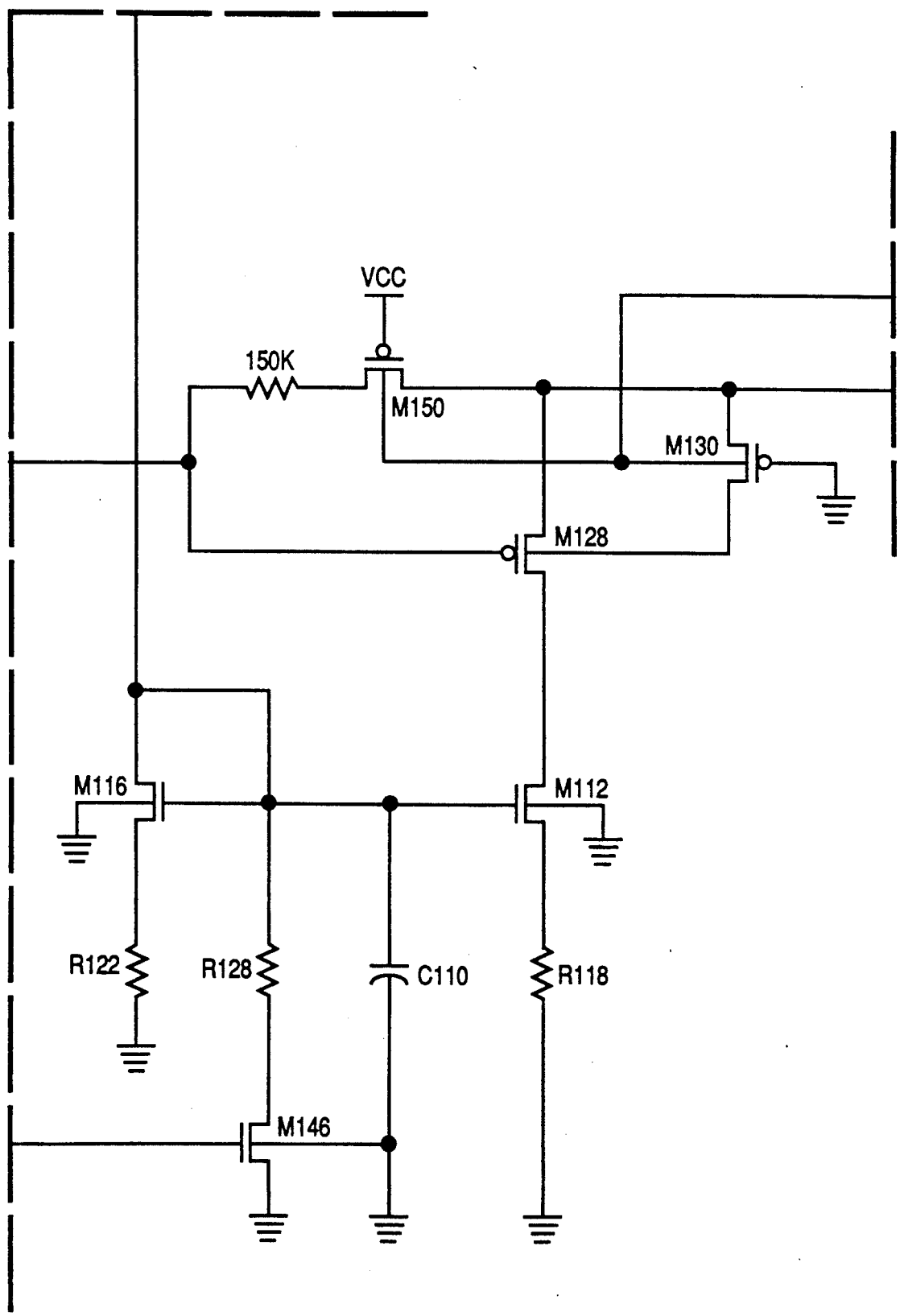

It is particularly critical to match the current through transistor M10 and M12 as closely as possible. To this end, the layout of the pair of transistors in each current mirror is shown in FIGS. 2 and 3. FIGS. 2 and 3 show source (S), gate (G), and drain (D) regions for transistors M16 and M12, and the LDD regions (n−). For example, consider transistors M16 and M12 as exemplary. In order to minimize the effects of different layer thicknesses due to processing variations across the chip, transistors M16 and M12 are located and constructed proximate each other on the integrated circuit chip. In addition, transistors M16 and M12 are dimensionally matched with the same length to width ratios. In order to increase their breakdown voltage, transistors M16 and M12 are LDD (lightly doped drain) type transistors. Since the physical placement of the gate is very critical with LDD type transistors, transistors M16 and M12 are laid out side by side on the integrated circuit so that the drain of one transistor faces the source of the other transistor. The distance d separating the gates is tightly controlled in a masking step. However, the placement of the gates relative to source/drain regions is normally not as accurately controlled. This means that a slight misplacement of the gates results in a shrinking of the LDD region immediately to one side of the gate and the extension of the LDD region on the other side. Since the transistor is very sensitive to the dimensional effect of the LDD region, the arrangement shown ensures that both transistors M16 and M10 will be affected similarly by any misplacement of the gate electrode. This will keep the transistors matched. Transistors M14 and M10 are laid out in a similar manner.

In order to prevent transistor M18 from turning on or off too fast, a biasing circuit of capacitor C12 and resistors R30 and R32 is provided. Data to be transmitted to the serial bus is received as the DAT signal. An OR gate 18 receives the DAT signal and the OOR (out of range) signal and provides its output to CMOS inverter 20 and NAND gate 22. (The OOR signal is provided to block data transmission when the common mode voltage is deviates too much from the midpoint voltage between VCC and ground.) Inverter 20 includes PMOS transistor M20 and NMOS transistor M22 connected between VCC and ground. Resistors R30 and R32 are connected between the drains of transistors M20 and M22. The common point between resistors R30 and R32 is connected to the gate of transistor M18, and capacitor C12 is connected between the gate of transistor M18 and ground.

Driver 10 is also provided with circuit elements which block voltage spikes on lines 12 and 14 which are higher than VCC or lower than ground. A voltage spike is blocked by preventing the formation of a conduction path in the integrated circuit. The elements which provide this protection are PMOS field effect transistors M24, M26, M28, M30 and M32, and NMOS field effect transistors M34, M36 and M38. Transistor M24 is series connected with transistor M10 and resistor R16 between high line 12 and the high voltage source VCC. Similarly, transistor M28 is series connected with transistor M12 and resistor R18 between low line 14 and the low voltage source ground. Since in a preferred embodiment the substrate of the chip is of P type conductivity, P type transistors M24 and M28 are constructed in the P substrate in a well of N type conductivity. It will be noted that all other connections to high line 12 and low line 14 are similarly made by P type transistors which are similarly constructed in the P substrate in a well of N type conductivity. In this manner the substrate of the chip is effectively isolated from any voltage spike appearing on line 12 or 14. In addition, the NMOS transistors are constructed directly in the P substrate.

The control electrode or gate of transistors M24 and M28 are connected to a control line 26 for receiving a data signal which connects or disconnects the current sources from lines 12 and 14. (The data signal received from control line 26 is a version of the DAT signal delayed by inverter 28, NAND gate 22, and NMOS transistor M40. Transistor M42 and resistor R38 bias transistors M24 and M28 off when the DAT signal is high.) The source of PMOS transistor M28 is connected to low line 14, its drain is connected to the drain of transistor M12, and its well tie is connected to the drain of transistor M30. The source of PMOS transistor M24 is connected to the drain of transistor M10, its drain is connected to high line 12, and its well tie is connected to the source of NMOS transistor M34. NMOS transistor M34 is constructed directly in the substrate of the integrated circuit and is electrically connected to transistor M24. However, since transistor M34 is not subject to negative voltage spikes from line 12 (being protected by PMOS transistor M26), there will be no current path into the substrate. The drain of transistor M34 is connected to the source of transistor M24, its gate is connected to VCC, and its substrate tie is connected to ground.

PMOS transistor M26 is connected between high line 12 and the control electrodes of transistors M24 and M28. More specifically, the source of transistor M26 is connected to high line 12, its drain is connected to the gates of transistors M24 and M28, its well tie is connected to the well tie of transistor M30, and its gate is connected to a biasing circuit which includes NMOS transistor M38 and resistor R34. The drain and gate of transistor M38 are connected to VCC, its source is connected to the gate of transistor M26, and its substrate tie is connected to ground. Resistor R34 is connected between the gate of transistor M26 and ground. The gate of transistor M26 also receives a reset signal in the form of high voltage VCC when the RST/ signal is active low.

In operation, a positive voltage spike in excess of VCC on high line 12 will appear at the drain of transistor M24. This spike could turn on transistor M24 so that current could flow between its drain and source. However, under such overvoltage condition, transistor M26 will also conduct, increasing the voltage on the gate of transistor M24. This will turn transistor M24 off thereby preventing a conduction path from high line 12 through transistor M24 to VCC. The drain and well tie of transistor M24 form a PN junction. A positive spike on line 12 would forward bias this junction thereby creating another leakage path. However, any voltage appearing on the well tie of transistor M24 will be blocked by NMOS transistor M34.

In order for transistor M26 to conduct when a high voltage spike appears on line 12, the gate voltage of transistor M26 must be set so that transistor M26 begins conducting approximately when the bus voltage on line 12 exceeds VCC. Transistor M38 is connected as a forward biased diode from VCC to resistor R34. When VCC is at its operational level, the voltage drop across transistor M38 and resistor R34 establish the required level for transistor M26. During a power-up sequence, some time may be required for this reference to reach its correct value. The p-channel transistor with its gate connected to RST/ serves to drive the reference voltage to its desired value quickly during power-up. The RST/ signal is only generated when VCC is ramping up.

PMOS transistors M30 and M32 and NMOS transistor M36 are shown in FIG. 1C. PMOS transistor M30 is electrically connected to transistor M28. More specifically, the drain of transistor M30 is connected the well tie of transistor M28, its drain is connected to low line 14, its gate is connected to ground, and its well tie is connected to VCC through biasing transistor M36. The gate and drain of NMOS transistor M36 are connected to VCC, its substrate tie is connected to ground, and its source is connected to the well tie of transistor M30 and the drain of transistor M32. The source of transistor M32 is connected to VCC, and its well tie and drain are connected together. The gate of transistor M32 is connected to low line 14 through resistors R36 and R14.

Resistors R36 and R14 are series connected between the gate of transistor M32 and low line 14. The common point between resistors R36 and R14 is connected to high line 12.

In operation, a positive voltage spike in excess of VCC on low line 14 will appear at the source of transistor M28. This spike could turn on transistor M28 so that current could flow between its source and drain. However, under such overvoltage condition, transistor M26 will also conduct, increasing the voltage on the gate of transistor M28. (It will be noted that an overvoltage or undervoltage condition on either line 12 or 14 will also be created on the other line by virtue of their connection through resistor R14.) This will turn transistor M28 off thereby preventing a conduction path from low line 14 through transistor M28 to ground. The source and well tie of transistor M28 form a PN junction. However, the well of transistor M28 is biased near the source potential of transistor M28 by transistor M30. Although a positive spike on line 14 would forward bias the source to well junction of transistor M28, no leakage path exists beyond this point. A possible conduction path, through the source/well tie PN junction of transistor M30, will be blocked by NMOS transistor M36. Transistor M32 provides a conduction path for any charge which would otherwise build up on the source of transistor M36.

FIGS. 4A-4F show an integrated circuit driver 110 according to another form of the present invention. The current sources driving high line 112 and low line 114 are arranged in current mirror configurations similar to those in the FIG. 1 embodiment. The first current source includes PMOS transistors M110, M114 and M144, and resistors R116, R120 and R126. The second current source includes NMOS transistors M112, M116 and M146, resistors R118, R122 and R128, and capacitor C110. The current sources are connected by resistor R124 and NMOS transistor M118. The operation of the current sources are similar to that described with respect to the FIG. 1 embodiment. It will be noted that transistors M144 and M146 are now provided to isolate the current mirrors during operation. Each transistor M144 and M146 is turned off, when driver 110 is on, in response to the data signal DAT/. This removes a potential source of a mismatch in the two current mirrors. The component values in the current mirror are as follows: R116 and R120—40 ohms, R118—80 ohms, R122—80 ohms, R126 and R128—168K ohms, and C110—15 pF.

PMOS transistors M124 and M128 block high voltage spikes on high line 112 and low line 114, respectively. In the FIG. 1 embodiment, both blocking transistors M24 and M28 are controlled by the same signal provided on input line 26. In the FIG. 4 embodiment, blocking transistors M124 and M128 are independently controlled. Thus, whereas a single transistor M26 in FIG. 1 provides a gate bias voltage for transistors M24 and M28, two transistors M148 and M150 are required in the FIG. 4 embodiment. The source of PMOS field effect transistor M148 is connected to high line 112, its drain is connected to the gate of transistor M124, and its gate is connected to a bias circuit comprising PMOS field effect transistor M152 and resistor R140. The source and well tie of transistor M152 are connected to VCC, its gate is connected to ground, and its drain is connected to the gate of transistor 148. Resistor R140 is connected between the drain of transistor 152 and ground. The source of PMOS field effect transistor M150 is connected to low line 112, its drain is connected to the gate of transistor M128, and its gate is connected to voltage source VCC.

As noted, transistors M148 and M150 provide gate biasing voltage to transistors M124 and M128, respectively, in response to a high voltage spike on high line 112 and low line 114, respectively. The well tie of each transistor M148 and M150 is protected from voltage spikes in a manner similar to that described for transistor M26 in FIG. 1. However, rather than the common circuit of transistors M30, M32 and M36 as in FIG. 1, each transistor M148 and M150 has its own well tie protection circuit. For transistor M148 the protection circuit includes transistors M154 and M156, and for transistor M150 the circuit includes transistors M130, M132 and M136, connected as shown.

As with the FIG. 1 embodiment, a single transistor M118 is connected to both matched current sources for turning the current sources on and off in response to a signal received on its control electrode. Current flow through each matched current source and lines 112 and 114 is controlled by transistors M124 and M128, respectively. It will be noted that each of transistors M118, M124 and M128 may be individually and selectively enabled by the means described below.

The enabling circuit for transistors M118, M124 and M128 includes timing circuit 210 and wave shaping circuit 212. Timing circuit 210 includes a series RC circuit with resistors R142, R144, R146, R148 and R150, and capacitor C116. The series RC circuit is connected to the output of series connected inverters 214, 216 and 218, inverter 214 receiving the DAT/ signal. The common points between adjacent elements in the RC network provide convenient tap points 220, 222, 224, 226 and 228. Statically, each tap point provides essentially the same voltage. However, during the dynamic transition of the DAT/ signal, these tap points will have different voltage levels. For example, when DAT/ transitions from a 1 to a 0, current will flow through the RC circuit with the voltage on node 220 being initially higher than the voltage on node 228. Timing circuit 210 also includes selector circuits 230, 232 and 234. Selector circuit 230 has PMOS transistor M158 and NMOS transistor M160 connected between tap points 220 and 222, respectively, and the gate of NMOS transistor M162 in wave shaping circuit 212. Selector circuit 232 has PMOS transistor M164 and NMOS transistor M166 connected between tap points 220 and 228, respectively, and the gate of transistor M118. Selector circuit 234 has PMOS transistor M168 and NMOS transistor M170 connected between tap points 224 and 226, respectively, and the gate of NMOS transistor M172 in wave shaping circuit 212.

Wave shaping circuit 212 includes a resistive circuit 236 series connected with transistor M162, and a resistive circuit 238 series connected with transistor M172. Resistive circuit 236 includes resistors R152, R154 and R156 series connected with NMOS transistors M174, M176, and M162 between VCC and ground. A tap point 240 between resistors R154 and R156 is connected to the gate of transistor M124. Resistive circuit 238 includes a resistor R158 series connected with NMOS transistors M178, M180 and M172 between VCC and ground. A tap point 242 between resistor R158 and transistor M180 is resistively connected through resistor R160 to the gate of transistor M128.

In operation, when an active low data signal DAT/ is received by driver 110, the output of inverter 214 goes high—turning off isolation transistor M144, and the output of inverter 216 goes low—turning off isolation transistor M146. The output of inverter 218 goes high—sequentially building voltages on nodes 220, 222, 224, 226 and 228. Transistors M158, M164, and M168 are enabled upon receipt of the DAT/ signal. In the embodiment shown, both transistors M158 and M164 are connected to node 220. Thus, transistors M162 and M118 are enabled at about the same time. A positive voltage on the gate of transistor M118 allows current to flow through resistor R120, transistor M114, resistor R124, transistor M118, transistor M116 and resistor R122, thereby enabling the current sources. When transistor M162 is enabled, node 240 is pulled towards ground. The relatively slow voltage drop on node 240 gradually enables transistor M124 thereby reducing a voltage surge onto high line 112. Transistor M168 is connected to node 224, which reaches a voltage high enough to enable transistor M172 after transistor M162 is enabled. The voltage on node 242 is controllably pulled towards ground to slowly turn on transistor M128. In this manner, transistor M124 is turned on slightly ahead of transistor M128. It has been found that by timing the relative turn on and turn off times of transistors M124 and M128, voltage glitches that would otherwise appear on lines 112 and 114 are reduced.

When the data signal DAT/ goes inactive high, transistors M118, M124 and M128 are turned off according to their respective tap points in timing circuit 210. In this manner, turn off transients are reduced.

In a preferred embodiment the following component values are employed:

R116—40 ohms; R118—80 ohms; R120—40 ohms;
R122—80 ohms; R124—50 ohms; R126—168K ohms;
R128—168K ohms; R140—180K ohms; R142—20K ohms;
R144—15K ohms; R146—10K ohms; R148—10K ohms;
R150—25K ohms; R152—7.5K ohms; R154—5K ohms;
R156—2.5K ohms; R158—20K ohms; R160—2.5K ohms;
C110—15 pF; C116—15 pF
M110—8160/12; M112—4050/12; M114—8160/12;
M116—4050/12; M118—4000/4; M124—16000/12;
M128—16000/12; M130—200/12; M132—215/12;
M134—200/12; M136—200/12; M144—28/4;
M146—14/4; M148—400/12; M150—400/12;
M152—10/20; M154—200/12; M156—215/12;
M158—24/4; M160—14/4; M162—14/4; M164—24/4;
M166—14/4; M172—24/4; M170—14/4; M172—56/4;
M174—200/12; M176—200/12; M178—200/12;
M180—400/12

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. An integrated circuit driver for high and low lines in a bus comprising:
   first and second current sources connected to high and low voltage sources, respectively; and first and second means for blocking voltage spikes higher or lower than the voltages provided by said high and low voltage sources;

wherein said first current source and said first blocking means are series connected between said high voltage supply and said high line, and said second current source and said second blocking means are series connected between said low voltage source and said low line.

2. The driver of claim 1 wherein said integrated circuit has a substrate of a first conductivity type, and wherein said first and second blocking means include first and second transistors, respectively, of said first conductivity type constructed in said substrate in a well of a second conductivity type.

3. The driver of claim 2 wherein said first blocking means further includes a third transistor of said second conductivity type constructed in said substrate and electrically connected to said first transistor.

4. The driver of claim 3 wherein said first and third transistors are MOSFET transistors.

5. The driver of claim 4 wherein the drain of said first transistor is connected to said high line, the well tie of said first transistor is connected to the source of said third transistor, the source of said first transistor is connected with the drain of said third transistor to said first current source, the gate of said third transistor is connected to a first voltage source and the substrate tie of said third transistor is connected to a second voltage source.

6. The driver of claim 5 wherein said first transistor is a PMOS transistor and said third transistor is an NMOS transistor.

7. The driver of claim 5 wherein said first voltage source is said high voltage source and said second voltage source is said low voltage source.

8. The driver of claim 5 wherein the gate of said first transistor is connected to a control line for receiving a data signal.

9. The driver of claim 2 wherein said second blocking means further includes a third transistor of said first conductivity type, constructed in said substrate in a well of said second conductivity type, and electrically connected to said second transistor.

10. The driver of claim 9 wherein said second and third transistors are MOSFET transistors.

11. The driver of claim 10 wherein the source of said second transistor is connected to said low line, the drain of said second transistor is connected to said second current source, the well tie of said second transistor is connected to the drain of said third transistor, the source of said third transistor is connected to said low line, the well tie of said third transistor is connected to a first voltage source through a biasing means, and the gate of said third transistor is connected to a second voltage source.

12. The driver of claim 11 wherein said second and third transistors are PMOS transistors.

13. The driver of claim 11 wherein said first voltage source is said high voltage source and said second voltage source is said low voltage source.

14. The driver of claim 11 wherein the gate of said second transistor is connected to a control line for receiving a data signal.

15. The driver of claim 11 wherein said second blocking means further includes a fourth transistor of said second conductivity type constructed in said substrate and electrically connected to the well tie of said third transistor.

16. The driver of claim 15 wherein said fourth transistor is a MOSFET transistor.

17. The driver of claim 16 wherein the source of said fourth transistor is connected to the well tie of said third transistor, the gate and drain of said fourth transistor are connected to said first voltage source, and the substrate tie of said fourth transistor is connected to said second voltage source.

18. The driver of claim 17 wherein said second and third transistors are PMOS transistors and said fourth transistor is an NMOS transistor.

19. The driver of claim 17 wherein said first voltage source is said high voltage source and said second voltage source is said low voltage source.

20. The driver of claim 17 wherein said second blocking means further includes a fifth transistor of said first conductivity type, constructed in said substrate in a well of said second conductivity type, and electrically connected to the source of said fourth transistor.

21. The driver of claim 20 wherein said fifth transistor is a MOSFET transistor.

22. The driver of claim 21 wherein the drain of said fifth transistor is connected to the source of said fourth transistor, the well tie and drain of said fifth transistor are connected, the source of said fifth transistor is connected to said first voltage source, and the gate of said fifth transistor is resistively connected to said low line.

23. The driver of claim 22 wherein said second, third and fifth transistors are PMOS transistors and said fourth transistor is an NMOS transistor.

24. The driver of claim 23 wherein said first voltage source is said high voltage source and said second voltage source is said low voltage source.

25. The driver of claim 22 wherein the gate of said fifth transistor is connected to said low line by first and second resistors series connected between the gate of said fifth transistor and said low line, and wherein said high line is connected to the common point between said first and second resistors.

26. The driver of claim 2 wherein said first and second blocking means include a third transistor of said first conductivity type constructed in said substrate in a well of a second conductivity type, said third transistor being connected between said high line and the control electrodes of said first and second transistors.

27. The driver of claim 26 wherein said first, second and third transistors are MOSFET transistors.

28. The driver of claim 27 wherein the source of said first transistor is connected to said first current source, the drain of said first transistor is connected to said high line, the source of said second transistor is connected to said low line, the drain of said second transistor is connected to said second current source, the source of said third transistor is connected to said high line, the drain of said third transistor is connected to the gates of said first and second transistors, and the gate of said third transistor is connected to biasing means.

29. The driver of claim 28 wherein said first, second and third transistors are PMOS transistors.

30. The driver of claim 28 wherein the gates of said first and second transistors are also connected to a control line for receiving a data signal.

31. The driver of claim 28 wherein said biasing means includes a fourth transistor of said second conductivity type constructed in said substrate and connected between a first voltage source and the gate of said third transistor.

32. The driver of claim 31 wherein said fourth transistor is a MOSFET transistor.

33. The driver of claim 32 wherein the drain and gate of said fourth transistor are connected to a first voltage source and the source of said third transistor is connected to the gate of said third transistor.

34. The driver of claim 33 wherein said third transistor is an NMOS transistor.

35. The driver of claim 33 wherein said first voltage source is said high voltage source and said second voltage source is said low voltage source.

36. The driver of claim 33 wherein said biasing means further includes a resistor connected between the gate of said second transistor and a second voltage source.

37. The driver of claim 33 wherein the gate of said third transistor is connected to a line for receiving a reset signal.

38. The driver of claim 1, wherein said first and second current sources include first and second transistors, respectively, said driver further comprising:
a current path including third, fourth and fifth transistors serially connected between said high and low voltage sources;
wherein the control electrodes of said first and third transistors are connected, and the control electrodes of said second and fifth transistors are connected.

39. The driver of claim 38 wherein said first and third transistors are of a first conductivity type and are dimensionally matched and constructed proximate each other on said integrated circuit, and wherein said second and fifth transistors are of a second conductivity type and are dimensionally matched and constructed proximate each other on said integrated circuit.

40. The driver of claim 39 wherein said first, second, third and fifth transistors are LDD MOSFET transistors.

41. The driver of claim 40 wherein:
said first and third transistors are laid out side by side on said integrated circuit so that the drain of one transistor faces the source of the other transistor; and
said second and fifth transistors are laid out side by side on said integrated circuit so that the drain of one transistor faces the source of the other.

42. The driver of claim 41 wherein said first and third transistors are PMOS transistors and said second and fifth transistors are NMOS transistors, and wherein the source of said first and third transistors are connected to said high voltage source and the source of said second and fifth transistors are connected to said low voltage source.

43. The driver of claim 42 further comprising:
a capacitor connected between the gate of said second transistor and said low voltage source to match the gate capacitance of said second and firth transistors with the gate capacitance of said first and third transistors.

44. The driver of claim 38 further comprising:
a first resistor connected between the gate of said first transistor and said high voltage source; and
a second resistor connected between the gate of said second transistor and said low voltage source.

45. The driver of claim 38 wherein the gate of said fourth transistor is connected to a control line for receiving a data signal.

46. The driver of claim 42 wherein the gates of said first and third transistors are connected to the drain of said third transistor and the gates of said second and fifth transistors are connected to the drain of said fifth transistor.

47. The driver of claim 38 further comprising:
a first resistor and sixth transistor series connected between the gate of said first transistor and said high voltage source; and
a second resistor and seventh transistor series connected between the gate of said second transistor and said low voltage source.

48. The driver of claim 47 wherein the gate of each of said sixth and seventh transistors is connected to a control circuit for turning said transistors off during operation of said first and second current sources.

49. The driver of claim 2 wherein:
said first blocking means includes a third transistor of said first conductivity type constructed in said substrate in a well of a second conductivity type, said third transistor being connected between said high line and the control electrode of said first transistor; and
said second blocking means includes a fourth transistor of said first conductivity type constructed in said substrate in a well of a second conductivity type, said fourth transistor being connected between said low line and the control electrode of said second transistor.

50. The driver of claim 49 wherein said first, second, third and fourth transistors are MOSFET transistors.

51. The driver of claim 49 wherein the source of said first transistor is connected to said first current source, the drain of said first transistor is connected to said high line, the source of said second transistor is connected to said low line, the drain of said second transistor is connected to said second current source, the source of said third transistor is connected to said high line, the drain of said third transistor is connected to the gate of said first transistor, the gate of said third transistor is connected to biasing means, the source of said fourth transistor is connected to said low line, the drain of said fourth transistor is resistively connected to the gate of said first transistor, and the gate of said fourth transistor is connected to said high voltage source.

52. The driver of claim 51 wherein said first, second, third and fourth transistors are PMOS transistors.

53. The driver of claim 52 wherein said biasing means includes a fifth transistor and resistor, said fifth transistor being a PMOS transistor with its source and well tie connected to said high voltage source, its gate connected to said low voltage source, its drain connected to the gate of said third transistor, and said resistor being connected between the drain of said fifth transistor and said low voltage source.

54. An integrated circuit driver, formed in a substrate of a first conductivity type, for high and low lines in a bus comprising:
first and second current sources connected to high and low voltage sources, respectively; and
first and second means for blocking voltage spikes higher or lower than the voltages provided by said high and low voltage sources;
wherein said first current source and said first blocking means are series connected between said high voltage supply and said high line, and said second current source and said second blocking means are series connected between said low voltage source and said low line;

wherein said first blocking means includes a first MOSFET transistor of said first conductivity type constructed in said substrate in a well of a second conductivity type, and a second MOSFET transistor of said second conductivity type constructed in said substrate, said first transistor being series connected with said first current source and said second transistor being connected to the well tie of said first transistor;

wherein said second blocking means includes third, fourth and fifth MOSFET transistors of said first conductivity type, constructed in said substrate in respective wells of said second conductivity type, and a sixth MOSFET transistor of said second conductivity type constructed in said substrate, said third transistor being series connected with said second current source, said fourth transistor being connected to the well tie of said second transistor, and said fifth and sixth transistors being connected to the well tie of said fourth transistor; and wherein said first and second blocking means further include a seventh MOSFET transistor of said first conductivity type constructed in said substrate in a well of a second conductivity type, and a eighth MOSFET transistor of said second conductivity type constructed in said substrate, said seventh transistor being connected between said high line and the control electrodes of said first and third transistors, and said eighth transistor being connected to the gate of said eighth transistor.

55. The driver of claim 54 wherein the drain of said first transistor is connected to said high line, the well tie of said first transistor is connected to the source of said second transistor, the source of said first transistor is connected with the drain of said second transistor to said first current source, the gate of said second transistor is connected to a first voltage source, the substrate tie of said second transistor is connected to a second voltage source, the source of said third transistor is connected to said low line, the drain of said third transistor is connected to said second current source, the well tie of said third transistor is connected to the drain of said fourth transistor, the source of said fourth transistor is connected to said low line, the well tie of said fourth transistor is connected to the source of said sixth transistor, the gate of said fourth transistor is connected to said second voltage source, the source of said sixth transistor is connected to the drain of said fifth transistor, the gate and drain of said sixth transistor are connected to said first voltage source, the substrate tie of said sixth transistor is connected to said second voltage source, the well tie and drain of said fifth transistor are connected, the source of said fifth transistor is connected to said first voltage source, the gate of said fifth transistor is connected to said low line, the source of said seventh transistor is connected to said high line, the drain of said seventh transistor is connected to the gates of said first and third transistors, the gate of said seventh transistor is connected to the source of said eighth transistor, and the drain and gate of said eighth transistor are connected to said first voltage source.

56. The driver of claim 55 wherein said first, third, fourth, fifth and seventh transistors are PMOS transistors and said second, sixth and eighth transistors are NMOS transistors.

57. The driver of claim 56 wherein said first voltage source is said high voltage source and said second voltage source is said low voltage source.

58. The driver of claim 57 wherein the gates of said first and third transistors are connected to a control line for receiving a data signal, and the gate of said seventh transistor is connected to a line for receiving a reset signal.

59. The driver of claim 58 wherein the gate of said fifth transistor is connected to said low line by first and second resistors series connected between the gate of said fifth transistor and said low line, wherein said high line is connected to the common point between said first and second resistors, and the gate of said seventh transistor is connected to said low voltage source by a third resistor.

60. An integrated circuit driver for high and low lines in a bus comprising:
   first and second current sources connected to high and low voltage sources, respectively;
   control means for turning said current sources on and off; and
   first and second means for controlling current flow between said first and second current sources and said said high and low lines, respectively, and for blocking voltage spikes higher or lower than the voltages provided by said high and low voltage sources;
   wherein said first current source and said first means are series connected between said high voltage supply and said high line, and said second current source and said second means are series connected between said low voltage source and said low line; and
   wherein said control means is connected to said first and second current sources.

61. The driver of claim 60, further comprising:
   means for selectively enabling each of said control means and said first and second means.

62. The driver of claim 61 wherein said first means includes a first transistor, said second means includes a second transistor, and said control means includes a third transistor.

63. The driver of claim 62 wherein said enabling means includes:
   means for timing when each of said first second and third transistors is turned on and off; and
   rate control means for controlling the rate at which each of said first and second transistors is turned on and off.

64. The driver of claim 63 wherein said timing means includes:
   a series RC circuit responsive to a data signal and having a plurality of tap points;
   first and second selector circuits connected between respective ones of said tap points and said rate control means; and
   a third selector circuit connected between at least one of said tap points and the control electrode of said third transistor.

65. The driver of claim 64 wherein said rate control means includes:
   a first resistive circuit, series connected with a fourth transistor between said high and low voltage sources, having a tap point connected to the control electrode of said first transistor for providing a first control voltage thereto; and a second resistive circuit, series connected with a fifth transistor between said high and low voltage sources, having a tap point resistively connected to the control electrode of said second transistor for providing a second control voltage thereto;

wherein the control electrode of said fourth transistor is connected to said first selector circuit, and the control electrode of said fifth transistor is connected to said second selector circuit.

66. The driver of claim 64 wherein
said series RC circuit includes a plurality of resistors connected at respective ones of said tap points;
each of said first, second and third selector circuits has a pair of complementary transistors; and
each of said transistors in said selector circuits is connected to a respective one of said tap points.

* * * * *